US 7,405,567 B2

(12) United States Patent  
McDowell

(10) Patent No.: US 7,405,567 B2  
(45) Date of Patent: Jul. 29, 2008

(54) TUNING LOW-INDUCTANCE COILS AT LOW FREQUENCIES

(75) Inventor: Andrew F. McDowell, Albuquerque, NM (US)

(73) Assignee: ABQMR, Inc., Albuquerque, NM (US)

( * ) Notice: Subject to any disclaimer, the term of this patent is extended or adjusted under 35 U.S.C. 154(b) by 0 days.

(21) Appl. No.: 11/507,296

(22) Filed: Aug. 21, 2006

(65) Prior Publication Data

US 2008/0042650 A1 Feb. 21, 2008

(51) Int. Cl.
 *G01V 3/00* (2006.01)
(52) U.S. Cl. .................. 324/318; 324/322
(58) Field of Classification Search .............. 324/318, 324/322
 See application file for complete search history.

(56) References Cited

U.S. PATENT DOCUMENTS

| 5,684,401 | A | 11/1997 | Peck et al. | |
|---|---|---|---|---|
| 6,242,915 | B1 | 6/2001 | Hurd | |
| 6,397,094 | B1 | 5/2002 | Ludeke et al. | |
| 6,487,437 | B1 | 11/2002 | Viswanathan et al. | |
| 6,512,941 | B1 | 1/2003 | Weiss et al. | |
| 6,788,061 | B1 | 9/2004 | Sweedler et al. | |
| 6,845,262 | B2 * | 1/2005 | Albert et al. ............ | 600/420 |
| 7,141,978 | B2 * | 11/2006 | Peck et al. ............. | 324/321 |
| 2002/0130661 | A1 * | 9/2002 | Raftery et al. ............ | 324/318 |
| 2005/0245814 | A1 | 11/2005 | Anderson et al. | |

FOREIGN PATENT DOCUMENTS

| CA | 2342047 A1 | 9/2001 |
|---|---|---|
| EP | 1304581 A2 | 4/2003 |
| WO | WO 01/73460 A1 | 10/2001 |
| WO | WO 2005/026762 A1 | 3/2005 |

OTHER PUBLICATIONS

Goloshevsky, A.G., et al; "Development of low field nuclear magnetic resonance microcoils"; Rev. Sci. Inst., vol. 76, p. 024101 (2005).

Moresi, G., et al.; "Miniature permanent magnet for table-top NMR"; Concept. Magn. Reson., v. 19B, p. 35 (2003).

Peck, T.L., et al.; "Design and analysis of microcoils for NMR microscopy"; J. Magn. Reson., v. 108, p. 114 (1995).

(Continued)

*Primary Examiner*—Brij B. Shrivastav
*Assistant Examiner*—Megann E Vaughn
(74) *Attorney, Agent, or Firm*—McDonnell, Boehnen, Hulbert & Berghoff LLP

(57) ABSTRACT

A method and apparatus for tuning and matching extremely small sample coils with very low inductance for use in magnetic resonance experiments conducted at low frequencies. A circuit is disclosed that is appropriate for performing measurements in fields where magnetic resonance is beneficially utilized. The circuit has a microcoil, an adjustable tuning capacitance, and added inductance in the form of a tuning inductor. The microcoil is an electrical coil having an inductance of about 25 nanohenries (nH) or less. Because additional inductance is purposefully added, the capacitance required for resonance and apparatus function is proportionally and helpfully reduced. The apparatus and method permit the resonant circuit and the magnet to be made extremely small, which is crucial for new applications in portable magnetic resonance imaging, for example.

15 Claims, 6 Drawing Sheets

OTHER PUBLICATIONS

Seeber, D.A., et al.; "Design and testing of high sensitivity microreceiver coil apparatus . . . "; Rev. Sci. Inst., v. 72, p. 2171 (2001).

Sorli, B., et al.; "Micro-spectrometer for NMR: Analysis of small quantities in vitro"; Meas. Sci. Technol., v. 15, p. 877 (2004).

Minard, K.R., et al.; "Solenoidal microcoil design, Part I: Optimizing rf homogeneity"; Concepts in Magn. Reson., v. 13, p. 128 (2001).

Hoult, D.I., et al.; "The SNR of the NMR experiment"; J. Magn. Reson., v. 24, p. 71 (1976).

Abragam, A.; "Principles of Nuclear Magnetism" (Clarendon Press, Oxford), pp. 71-83 (1961).

Fukushima, E., et al.; "Experimental Pulse NMR; A Nuts and Bolts Approach" (Addison-Wesley Pub. Co., MA), pp. 311, 342, 374 (1981).

* cited by examiner

TUNING LOW-INDUCTANCE COILS AT LOW FREQUENCIES

BACKGROUND OF THE INVENTION

1. Field of the Invention (Technical Field)

The present invention relates to resonant electrical circuits containing inductors and capacitors, particularly when the inductance is very low and the circuit must resonate at a low frequency. More specifically, this disclosure is directed to a method for tuning and matching extremely small sample coils with very low inductance for use in magnetic resonance experiments conducted at low frequencies.

2. Background Art

Magnetic resonance experiments and procedures typically are performed using an electrically resonant circuit, with a coil (inductor L) wrapped around a sample to be evaluated, and a capacitor (capacitance C) connected to the coil to form a series or parallel resonant LC circuit. The frequency at which the electrical resonance must occur is determined by the strength of the magnetic field used, as well as the properties of the nucleus (or electron) being studied.

The arts of Nuclear Magnetic Resonance (NMR) and Magnetic Resonance Imaging (MRI) recently have advanced in the field of sample miniaturization. Miniature sample magnetic resonance systems employ very small sample coils. Such small coils allow NMR experiments on, for example, mass-limited samples or highly localized MRI information. The use of small coils, which have low inductance, in electrically resonant circuits becomes increasingly difficult as the size of the coil is reduced and/or the required resonance frequency is reduced. The resonance frequency is typically low for miniaturized experiments, when a small, weak permanent magnet is used. To date, NMR and MRI experiments at low frequencies (below 100 MHz) have been performed with "millicoils" or "mini-coils" of relatively large size. Experiments using very small coils have always been carried out at relatively much higher frequencies. In contrast, the invention disclosed hereinafter allows the use of the smallest possible coils in NMR and MRI procedures carried out at the lowest possible frequencies.

Very small coils for use in NMR spectroscopy at relatively high frequencies have been described previously.

T. L. Peck, et al., were among the first to extend the analysis of coil circuit performance in magnetic resonance to very small coils. They identified the signal-to-noise ratio advantage of small diameter coils for samples with limited volume. A Peck, et al. study, conducted at 4.7 Tesla (200 MHz), was of small coils with diameters ranging from 0.050 mm to 0.860 mm and larger. However, even with their smallest coil, which had an inductance of only 4 nH, Peck, et al. did not face the challenge of resonating a very small coil at a very low frequency. Their tuning circuit layout discussion focused on the lengths of the leads of their small coil, although they discuss only the resistance of these leads, and not their stray inductance. Peck, et al., did not use a tuning inductor. T. L. Peck, R. L. Magin, and P. C. Lauterbur, "Design and Analysis of Microcoils for NMR Microscopy," *J. Magn. Reson.* 108, 114-124 (1995).

U.S. Pat. No. 6,788,061 to Sweedler, et al., appears to describe an NMR apparatus with a sample holder having a containment region that holds a volume of less than about 1 microliters of the analyte sample, and a coil which encloses the containment region of the analyte sample holder and the contained sample. The coil is operatively associated with the analyte sample in the containment region of the sample holder, such that the coil can transmit and/or receive energy from the analyte sample in the containment region. This '061 patent contemplates operation of the system at very high frequencies, and mentions a sample of volume <10 microliters and magnets less than 50 kg. However, even though small coil usage in mico-NMR applications at low magnetic field are discussed in the '061 patent, no reference is made to resonance tuning. The '061 patent describes experiments carried out in a magnetic field of 7 Tesla, corresponding to a resonance frequency of 300 MHz. Hence, Sweedler, et al. did not confront the problem of resonating a small coil at low frequency.

U.S. Pat. No. 5,684,401 to Peck, et al., appears to teach compensation of magnetic susceptibility variation in NMR microspectroscopy detection coils. The disclosed apparatus does not employ a tuning inductor. When discussing a tuning circuit, the '401 patent concedes that their preference to move the tuning capacitance physically away from the small coil will result in a degradation of electrical performance. This concession follows convention, which teaches that extra "lead," or "stray" inductance is to be avoided.

Seeber, et al., explored microcoil performance experimentally, using a field of 9 Tesla (383 MHz). While they used coils as small at 0.020 mm in diameter, their tuning circuits evidently never contained a tuning inductor, as their high operating frequency made this unnecessary. Seeber, et al., attempted to reduce stray inductance by placing very small capacitors as close as possible to the coils. They also made an extensive, systematic study of the deleterious effects of stray inductance. D. A. Seeber, R. L. Cooper, L. Ciobanu, and C. H. Pennington, "Design and testing of high sensitivity microreceiver coil apparatus for nuclear magnetic resonance and imaging," *Rev. Sci. Inst.*, 72, 2171 (2001).

U.S. Pat. No. 6,242,915 to Hurd seems to teach a field-frequency lock system for an MRI system that includes a small coil and resonant sample located to sense changes in the polarizing magnetic field. The apparatus is operated at a high frequency of 205 MHz. Changes are detected as a shift in frequency of the NMR signal produced by the resonant sample, and the frequency shift is used to compensate the MRI system. This patent deals with moderately large coils for use at moderately high frequency and does not seem to require any special tuning schemes beyond the traditional.

The prior art examples listed above suggest that the challenge of resonating a very small coil (<20 nH) at low frequencies (<100 MHz) has not been faced because the work has all been carried out in strong magnetic fields, and has involved 1H nuclei.

Moresi and Magin describe a low field NMR system using a permanent magnet operating at 0.6 T (25.5 MHz), and discuss motivations for assembling a small system using a permanent magnet. Moresi, et al., purport to that show a system can perform NMR by providing a sample coil with diameter 4 mm and inductance 168 nH. With such a relatively large coil, they faced no particular challenge in building a resonance circuit, thus employed a conventional circuit design. G. Moresi and R. L. Magin, "Miniature permanent magnet for table-top NMR," *Concept. Magn. Reson.* 19B, 35-43 (2003).

Goloshefsky, et al., discuss small-coil-based NMR and MRI systems for industrial applications, and the advantages of using very small coils. Goloshefsky et al.'s system operates at a low magnetic field of 0.6 Tesla, corresponding to an operating frequency of around 25.5 MHz. However, their coils are relatively very large (two flat spirals, each with outer diameter 3.5 mm), with a large enough inductance (81 nH) that they can resonate in the traditional manner without significant difficulty. A. G. Goloshevsky, J. H. Walton, M. V.

Shutov, J. S. de Ropp, S. D. Collins, M. J. McCarthy, "Development of low field nuclear magnetic resonance microcoils," *Rev. Sci. Inst.* 76, 024101 (2005).

Sorli, et al., describe the design and construction of a planar small coil system for operation at 2 Tesla (85 MHz). They point out that very small coils have the potential for integration with microfluidic "lab-on-a-chip" devices. The coil of the Sorli, et al. system is rather large (0.5 mm on a side), and they describe their resonance circuit as "conventional." B. Sorli, J. F. Chateaux, M. Pitival, H. Chahboune, B. Favre, A. Briguet, P. Morin, "Micro-spectrometer for NMR: Analysis of small quantities in vitro," *Meas. Sci. Technol.* 15, 877-880 (2004).

The three immediately previous publications, concerning the use of so-called "microcoils" to perform NMR at low frequency, utilized relatively large (~1 mm diameter, $L \geq 100$ nH) coils. Another particularly active area of application of small coils at relatively low frequency is in MRI, where the typical magnetic field strength is 1.5 Tesla, yielding a resonance frequency of about 64 MHz. The following publications are representative of efforts in this general area.

U.S. Patent App. Publication No 2005/0245814 to Anderson, et al., appears to disclose a method for determining the position and/or orientation of a catheter or other interventional access device or surgical probe using phase patterns in a magnetic resonance (MR) signal. The process employs a large coil (4 mm outside diameter), said to operate at about 1.5 Tesla (~64 MHz). There is no apparent reference to any resonance tuning procedures for the coils.

Published International Patent Publication No. WO2005026762, to Weiss, appears to show an MR process for locating a medical instrument with a very small coil attached thereto in the examination volume of an MR device. The coil is part of a resonant circuit matched to the resonant frequency of the MR device and having no external controls. According to the disclosure, the small coil is part of a resonant circuit tuned to the resonant frequency of the MR device, which circuit is unconnected to any of the other components of the MR device. However, the does not appear to be any detailed teaching of a tuning method or of the magnetic filed used.

European Patent EP1304581 to Gleich shows a method for localizing an object, preferably a medical instrument, introduced into a body. The object is in the examination volume of an MR device, which evaluates the interaction between an electromagnetic resonant circuit, mounted on the object, and an RF field applied in the MR device for nuclear magnetization of the body. While an extremely small coil is used in the resonance circuit, no description is provided of a method or means for tuning.

International Patent Publication No. WO0173460 to Fuderer, et al., offers an interventional magnetic resonance method utilizing a very small coil. The method purports to enable localization of an interventional instrument by detection of magnetic resonance signals from the surroundings of the small coil under the influence of magnetic field gradients. The disclosure focuses on localization method through micro-NMR, but does not include any tuning references or frequency details.

Canadian Patent CA2342047 to Raghavan, et al., shows a device, such as a medical device, having a distribution of "microcoils" (pairs) that may be used within an organism under MRI visualization. At least one or each microcoil of the opposed pair of microcoils has at least a region where a diameter circumscribed by a first winding is greater than the diameter circumscribed by at least one complete second winding, especially an adjacent winding displaced from the first winding along an axis or core of the medical device or an axis of the microcoil. The second winding is nearer to or farther from an intermediate region between the microcoils that define the pair of microcoils. The device description does not include references or details regarding the frequency or the tuning procedure. The preferred coils have relatively large diameters between 1 mm and 4 mm.

U.S. Pat. No. 6,512,941 to Weiss, et al., discloses a device and method for exciting the nuclear magnetization in a limited volume of an object to be examined, utilizing a very small coil which is present in the volume and is attached, for example, to an interventional instrument during the formation of a magnetic resonance image of the object to be examined. However, no tuning of the coil is described.

U.S. Pat. No. 6,397,094 to Luedeke, et al., teaches an MR method which utilizes a very small coil without connection leads which causes a change in phase of an external RF magnetic field in its direct vicinity within an object to be examined. This increase apparently can be used to localize the coil, to image the direct vicinity, or to track the propagation of a liquid flow passing through the direct vicinity. However, no tuning of the microcoil is described.

Accordingly, the prior art apparently makes no reference to the difficulty of resonating very small coils at low frequencies. All coils with inductances comparable to 25 nH have been utilized, it is believed, at frequencies of 200 MHz and above. Coils used at 64 MHz or less have all been large, with diameters on the scale of millimeters, with inductances exceeding 80 nH. The particular challenge of resonating the smallest coils at low frequencies has not been faced, and therefore it previously has not been solved.

The challenge has also not been anticipated because those skilled in the art likely would apply the conventional solution to resonating a small coil at low frequency, that is, by simply increasing the capacitance. The problem with such an approach is that resonating a 10 nH inductor at 40 MHz, for example, would require a capacitor of value of 1580 pF. Since the electrical resonance frequency must match the magnetic resonance frequency, the capacitance must be adjustable. An adjustable capacitor of value above 1000 pF would be physically very large. An alternative is to use both a fixed-value capacitor of small physical size but large capacitance together with a physically small adjustable capacitance. The drawback of this perceived solution is a dramatic reduction in the range of capacitance adjustability.

The historical development of the art relating to the optimization of detector coil performance in magnetic resonance experiments is helpfully revealed in the seminal publication by D. I. Hoult and R. E. Richards, "The SNR of the NMR Experiment," *J. Magn. Reson.* 24, 71 (1976). Hoult and Richards highlight the then-state-of-the-art understanding of coil performance (exemplified by their first reference: A. Abragam, *Principles of Nuclear Magnetism*, Oxford University Press, pp. 71-83 (1961)), by identifying shortcomings in the known art and proposing a more fundamental, general, and accurate approach to understanding the performance of detector coils.

The state-of-the-art prior to the 1976 Hoult and Richards publication expressed coil performance in terms of coil volume, sample filling factor (the fraction of the coil volume occupied by the sample in the usual situation where there is a single coil used as the NMR sample coil), coil inductance, and resonant circuit quality factor ("Q factor"), among other concepts. The conventional wisdom with regard to sample filling factor was to maximize the sample's "exposure" to the radiofrequency magnetic field generated by all parts of the resonance circuit. This meant, for example, minimizing the lengths of wires connecting the coil to the rest of the resonant circuit in order not to generate "wasted" fields.

Hoult and Richards developed an approach based on concepts more closely tied to the physics of the detection process. They utilized the Principle of Reciprocity to rigorously calculate the strength of the signal that would be detected, and ascribing the electrical noise that serves to obscure the desired signal to various details of the experiment. The end result of Hoult and Richards' efforts was an equation for calculating detector coil performance that is better grounded in fundamental principles than previous approaches. Specifically, their result is expressed in terms of the coil's efficiency in producing magnetic field at the sample location (defined as the field produced per unit current in the coil) and the resistance in the resonant circuit. Taking this result as a guide for designing detector coils and circuits, a researcher in the art is inexorably led to the conclusion that the best design maximizes the magnetic field intensity generated by a unit current in the coil, divided by the square root of the circuit resistance. A practical realization of this criterion is to minimize the time required to tip the spins by, say, 90 degrees, the so-called "90-degree pulse." These design goals are equivalent to maximizing the Q-factor, inductance, filling factor, etc., only for a simple solenoid that is full of the sample and is a part of a compact resonant circuit—the usual case for NMR/MRI. In the general case, one must use the Hoult and Richards criterion, and not the older approach. This fact seems to have remained unrecognized prior to the present disclosure, even in the extension of the Hoult and Richards methodology to the regime of very small detector coils presented by Peck, et al. T. L. Peck, et al., "Design and Analysis of Microcoils for NMR Microscopy," *J. Magn. Reson.* B 108, 114 (1995).

An adverse aspect of the Hoult and Richards approach is that the concepts used to describe coil performance are abstract and somewhat difficult to measure for many practitioners. The conceptual units of the previous approach of Abragam, for example, are more concrete and readily measured. Ideas like inductance, volume, filling factor, Q-factor, etc. are understood from introductory-level physics or radio technology, and there are inexpensive instruments to measure these quantities and simple methods for calculating them. Hoult and Richards recognized the conceptual value of the other approach, and showed in an appendix how their result could be used to derive the Abragam-style result, under the assumption that the filling factor was maximized. Significantly, while the Hoult and Richards result can be used to derive the Abragam-style result, the reverse is not true. The Hoult and Richards result is more general.

Thus, it is believed that the early formulation of coil performance in terms of inductance, volume, filling factor, and Q-factor have seen continued use in the art of magnetic resonance, and Abragam's book remains a popular reference in the field. The fact that the Abragam-style approach dominates current thinking is readily seen in the literature, including references mentioned hereinabove. Evidently, the Hoult and Richards result did not succeed in altering the standard methodology for designing optimal detector coils for magnetic resonance experiments, because the early formulation works for the vast majority of NMR/MRI applications. Indeed, when the Hoult and Richards article is cited in the literature, it is often used to support the notion that filling factor should be maximized, which is a misinterpretation of the result given in their appendix. From this it is evident that concepts such as the filling factor, Q-factor, etc. are highly misleading when it comes to building optimized detector coils.

The present invention was developed against the foregoing background. The present approach is contrary to prior art teaching, because the prior art has not recognized the full implications of the Hoult and Richards result. This disclosure provides a solution for tuning small inductances at low frequencies that is much more convenient than the conventional approaches. Beyond convenience, the disclosed apparatus and method permits the resonant circuit and the magnet to be made very small, which is crucial for new applications in portable MRI, for example.

SUMMARY OF THE INVENTION (DISCLOSURE OF THE INVENTION)

There is provided an apparatus and method for tuning low-inductance coils at low frequencies. An innovative circuit is disclosed that would be appropriate for performing measurements in fields where magnetic resonance is beneficially utilized. The circuit has a microcoil, an adjustable tuning capacitance, and a tuning inductor. In this description and claims, "microcoil" refers to an electrical coil having an inductance of about 25 nanohenries (nH) or less. (It should be noted that prior art publications occasionally use "microcoil" to refer to coils of comparatively and significantly larger inductance.) A microcoil having such a very low inductance is often much smaller than a common tuning inductor. The circuit elements are electrically connected, as by wires which may be attached to the elements as "leads," or added separately during construction using other connection techniques known to practitioners of the art. The innovation features the inclusion of the tuning inductor in addition to the microcoil. As additional inductance is purposefully added, the capacitance required for resonance and apparatus function is proportionally and helpfully reduced.

Several objects and advantages of the disclosed apparatus and method are evident. The disclosure permits the resonating of low inductance coils at low frequencies without:

(1) the use of physically large adjustable capacitors;

(2) the use of high-fixed-value capacitors together with a variable capacitor, which reduces the range of adjustability; and (3) the need to mount capacitors very near the coil, which can be a significant challenge and may distort the magnetic field at the sample.

Other objects and advantages include:

(1) enabling the miniaturization of coils used in resonant circuits known to the prior art, when the resonant frequency must be kept low;

(2) the operation of small coils in resonant circuits at arbitrarily low frequencies, generally less than 100 MHz.;

(3) the invention allows the miniaturization of small coils used in NMR and MRI;

(4) the provision of an apparatus that works with a multiplicity of small coils; and (5) the location of the miniaturized sample coil remotely from the tuning capacitance and inductance.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the presently disclosed apparatus and, together with the description, serve to explain the principles thereof. The drawings are only for the purpose of illustrating preferred embodiments, and are not to be construed as limiting the invention. In the drawings.

Figure 1:
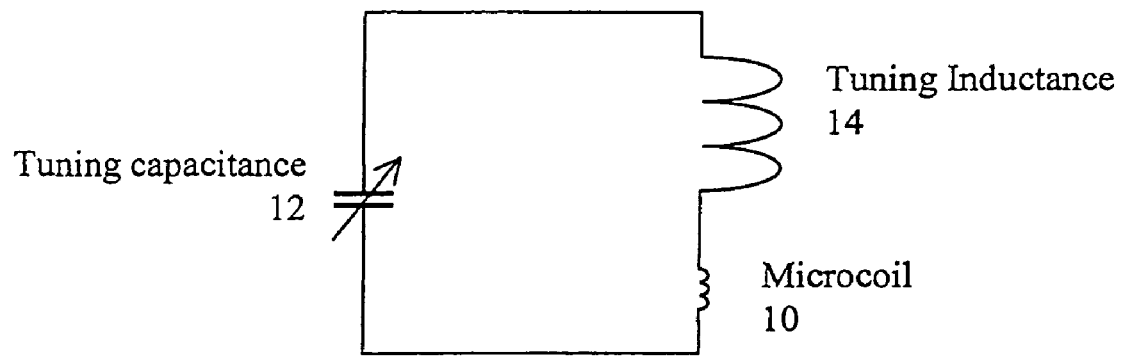
FIG. 1 is a schematic depicting a basic embodiment of an electrical LC resonating circuit according to the present disclosure, in which a tuning inductor is connected in series with a miniaturized or "micro" sample coil.

DESCRIPTION OF THE PREFERRED EMBODIMENTS (BEST MODES FOR CARRYING OUT THE INVENTION)

There is disclosed herein an apparatus and method for tuning low-inductance coils at low frequencies. A purpose of the disclosed apparatus and method is to allow a very small coil of negligible inductance to be resonated electrically at low frequency, while readily maintaining frequency adjustability over a wide range of values using standard variable capacitors. "Low frequency," in this application, means less than about 100 MHz. The main application of the disclosed circuitry is in the field of Nuclear Magnetic Resonance (NMR), although it is useful for any situation requiring a tunable resonant circuit containing a very small coil. Properly implemented, the disclosed circuit introduces few or no electrical losses into the resonant circuit, and the circuit maintains maximal efficiency for the detection of NMR signals.

The disclosure includes a LC resonance circuit that would be appropriate for performing magnetic resonance experiments, among other beneficial purposes. The circuit has a microcoil, an adjustable tuning capacitance, and a tuning inductor. A microcoil having an inductance of 25 nH or less is often much smaller than a tuning inductor. The circuit elements are connected by wires, which may be attached to the elements as "leads," or added separately during construction using connection techniques known to practitioners of the art. The innovation features the inclusion of the tuning inductor in addition to the microcoil.

This present disclosure is contrary to conventions in the art. In addition to suggesting the standard solution of adding more capacitance to achieve resonance at lower frequency, the prior art appears to teach against adding inductance that is not a part of the NMR coil. This additional inductance often is referred to as "stray" inductance. Prior efforts in the related art, such as U.S. Pat. No. 5,684,401 to Peck, et al., and articles by D. A. Seeber et al. (*Rev. Sci. Inst.*, 72, 2171 (2001)) and G. Moresi, et al. (G. Moresi *Concept. Magn. Reson.* 19B, 35-43 (2003)), take steps to reduce this unwanted stray inductance by placing the capacitors as close as possible to the coil.

The prior art also admonishes that the "filling factor" (the fraction of the inductance occupied by the sample material) must be maximized to optimize coil performance. Such teachings are found in, for example, E. Fukushima and S. B. W. Roeder, "Experimental Pulse NMR: A Nuts and Bolts Approach," Addison-Wesley, Reading, Mass. (1981), p 311, p 342, p 374; K. R. Minard, R. A. Wind, "Solenoidal microcoil design, Part I: Optimizing rf homogeneity," *Concepts in Magn. Reson.* 13, 128-142 (2001); A. Abragam, "Principles of Nuclear Magnetism," Clarendon Press, Oxford (1961), p 82). In these instances, the prior art leads circuit builders to eliminate stray inductances because they are inductances that exist in regions where there is no sample. The present method, in marked distinction, purposefully introduces a very large amount of extra ("stray") inductance, and reduces the filling factor of the circuit design to nearly zero, yet works well.

The challenge of resonating a low inductance coil at low frequencies is worth facing and solving. The use of small (low-field) permanent magnets together with microcoils offers many advantages in cost, portability, ease of integration with other techniques, and siting of the equipment in restrictive environments and non-laboratory locations. These advantages may open up new applications for NMR in education, industry, point-of-care and point-of-diagnosis medicine, environmental testing, and science. Many MRI applications of microcoils may benefit from the reduction of the coil size, at which time the challenge of resonating the smaller coils must be addressed. Advances in magnetic resonance techniques that require both miniaturizing the sample coil and reducing the operating frequency require a method for resonating low inductance coils at low frequencies. The present disclosure addresses these developing needs.

A preferred embodiment of the circuit of the present invention is depicted in FIG. 1. This circuit would be appropriate for magnetic resonance experiments, among others. The circuit of FIG. 1 may be construed as parallel or series resonant, depending upon how other MR/NMR system components are coupled to it. For the discussion immediately following, FIG. 1 may be assumed to be a parallel resonant circuit. The circuit has a microcoil 10, an adjustable tuning capacitor 12, and a second coil functioning as a tuning inductor 14. A microcoil 10, preferably having an inductance of approximately 25 nH or less, is generally much smaller than a tuning inductor. The tuning capacitance 12 and the tuning inductance 14 together constitute the principal elements of the resonant circuit. The circuit elements are connected by wires, which may be attached to the elements as "leads," or added separately during construction using connection techniques known to practitioners of the art. The presence in the circuit of both the tuning inductor 14 and the microcoil 10 is a basic facet of the present disclosure.

The microcoil 10 may be any electronically conducting structure intended to create a magnetic field at the location of a material under study. The microcoil 10 may be designed and built in any manner, using techniques known to practitioners of the art. For example, the microcoil 10 can be built by winding copper, silver, gold, or other wire to form a helical coil. The wire may be round, rectangular, or elliptical in cross section. Microcoil 10 may also be constructed by patterning a metallic layer on a non-conducting support material, so that the metallic layer has the configuration of a helix. In an experiment that uses such a coil, the material being studied is placed inside the helix. Alternatively, the microcoil 10 may be flat (or planar) in shape, and the material being studied is placed very close to a planar face of the coil. Microcoil 10 may also have the form of a flat planar coil that has been bent to define a curve, so that the concavo-convex coil fits around or inside the material under study. The microcoil 10 may also be a structure compounded of the shapes described above. The microcoil 10 may be designed and built in any manner, using proprietary or public domain techniques, as required for any particular experiment. In a first embodiment of the disclosed apparatus, the microcoil 10 preferably has an inductance sufficiently low such that, without the use of the auxiliary tuning inductor, an inconveniently large tuning capacitor would have been required.

The microcoil 10 need not necessarily be a single coil. As particular applications may suggest, alterative circuit embodiments may substitute a plurality of microcoils 10' connected electrically in series (FIG. 1A) or in parallel (FIG. 1B) for a single coil 10. The assembled plurality of microcoils 10' is then connected in series or parallel with the tuning inductance 14 in the resonating circuit.

Similarly, the adjustable tuning capacitor 12 may be constructed from one or more capacitors, which may each be either fixed or adjustable. Any capacitor technology and any arrangement of multiple capacitors may be used.

The tuning inductor 14 is constructed using any of the techniques known in the art. For example, it may be formed from wire wound in a helix or in a flat spiral, or it may take any other form as long as it remains an inductor. The wire may be copper, silver, gold, or any other electrically conducting material. The wire may be solid, stranded, woven, a specialty wire such at "Litz" wire, or evaporated onto a capillary. The wire may be operated at a reduced temperature, and may be operated in a superconducting state. The tuning inductor 14 may be compounded of separate inductors, which each separate inductor having the same or a different construction or form.

The tuning inductor 14 very preferably has a sufficiently large inductance that it can be resonated with a tuning capacitor that is of a pragmatically convenient size. In many cases, the inductance of the tuning inductor 14 preferably is at least ten times larger than the inductance of the microcoil 10. Thus, the tuning coil 14 has an inductance substantially larger than the inductance of the microcoil 10, so that the microcoil is an effective magnetic resonance transmitter or receiver coil, and yet contributes no substantial inductance needed for resonance.

Figure 2:
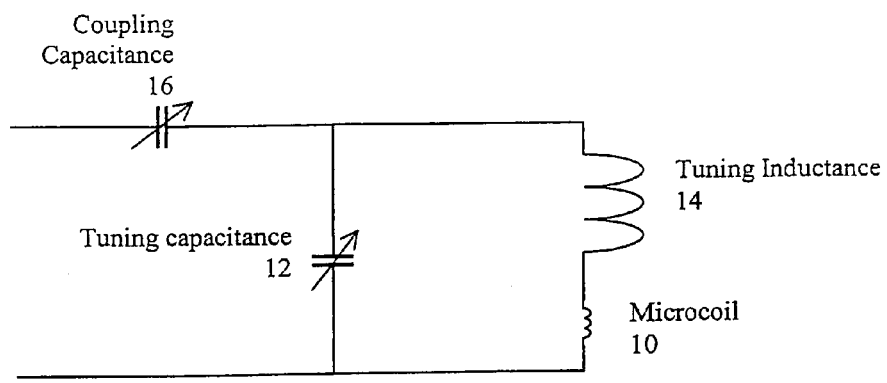
FIG. 2 is a schematic diagram indicating how an electrical circuit according to the present disclosure could be implemented in a magnetic resonance experiment.

When the closed series resonance LC circuit of FIG. 1 is in use, its electrical signals are communicated to the remainder of a NMR or MRI apparatus. This can be done in a large variety of ways. One example, shown in FIG. 2, employs a matching or "coupling" capacitor 16 connecting the junction between the tuning capacitance 12 and the tuning inductor 14. An additional connection typically is provided to the other terminal of the tuning capacitance 12, so that the overall resonance circuit presents two terminals to the remainder of the NMR/MRI electronics. A nearly limitless variety of coupling circuits, utilizing either capacitive or inductive coupling, are known to practitioners skilled in the art, and may be adapted for use in the method. All of such coupling/communication schemes apply to the microcoil tuning circuit shown in FIG. 1.

This apparatus and method is most beneficial in circumstances where the use of a very small sample coil (the "microcoil") is desired, yet while the sample coil must be brought into electrical resonance at a frequency so low that a capacitor of inconveniently large physical size otherwise would be required (i.e. if a conventional resonance circuit was employed). In describing the operation of the invention, it is assumed that the operator already possesses a microcoil, and seeks to resonate that microcoil at an inconveniently low frequency.

Known circuit theory teaches that in an LC resonant circuit, the total inductance L and total capacitance C serve to store electrical energy. The stored energy alternates between being stored in the capacitance and being stored in the inductance. The rate at which the energy moves back and forth is the electrical resonance frequency, which may be calculated using:

$$f = \frac{1}{2\pi} \frac{1}{\sqrt{LC}}$$

Hence, if the total inductance L has a very low value, a very large value of capacitance C is required to achieve a low value of the frequency f. For example, if the only inductance in the circuit is a microcoil of inductance 10 nH and the experiment is carried out in a field of only 1 Tesla (which sets the proton nuclear magnetic resonance frequency to be 42.6 MHz), the required capacitance is 1400 pF.

In the circuit of FIG. 1, the total inductance L will be the sum of the inductance of the microcoil 10 and the inductance of the tuning inductor 14. By introducing the tuning inductor 14, we can raise the value of total inductance to the point where the capacitance required to achieve the appropriate electrical resonance frequency is a convenient value. In fact, the tuning inductor 14 that achieves this convenience is very similar to a standard-sized sample coil for operation at the same required frequency. Persons knowledgeable in the art of NMR/MRI circuit construction are readily enabled to construct the required tuning inductor 14.

Care must be taken, however, when constructing the tuning inductor 14 so that the radiofrequency resistance of the tuning inductor is much less than the radiofrequency resistance of the microcoil 10. Otherwise, the tuning inductor 14 adds to the electrical noise of the resonant circuit, and the signal detection performance of the circuit is degraded. This occurs, for example, if the tuning inductor 14 is constructed from the same wire as the microcoil 10. Preferably, the tuning inductor 14 has less than about one-tenth of the RF resistance of the microcoil 10. This can be achieved, for example, by fabricating the tuning inductor 14 from very thick wire, by using stranded wire, by using Litz wire, by cooling the tuning inductor, or by using superconducting wire.

Thus, the microcoil 10 is in series with the second coil 14 which may, but need not necessarily, have a substantially larger (e.g., at least a factor of two, or even a factor of ten or more) inductance. The connected coils 10 and 14 form a resonant circuit with the capacitor 12, and the microcoil 10 functions as an effective magnetic resonance transmitter/receiver coil. The purposeful addition of inductance—which becomes increasingly important as the ratio of tuning coil to microcoil inductance exceeds ten—is contrary to the teachings of the prior art, but promotes the practical utility of the present invention.

Figure 6:
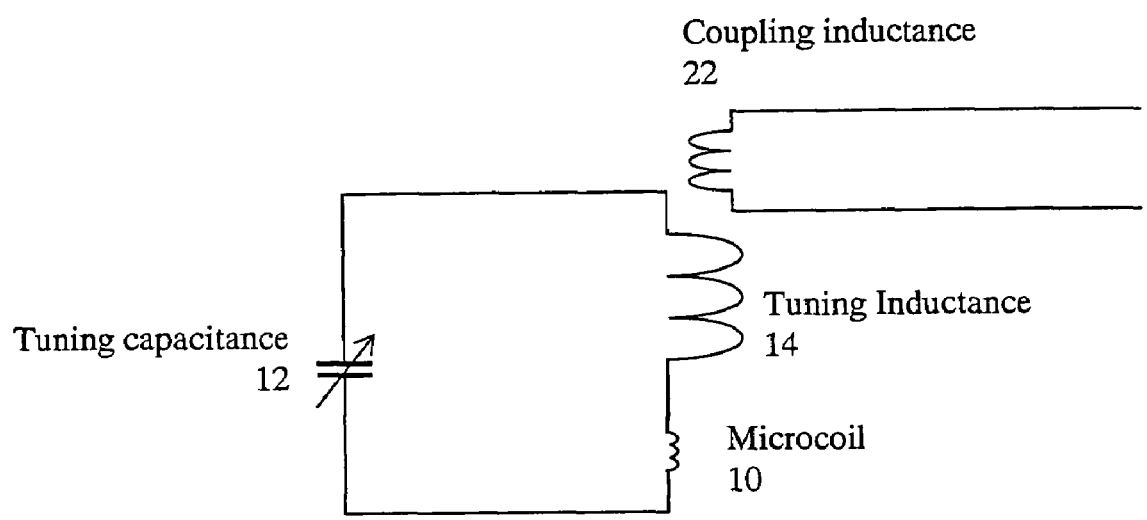
FIG. 6 is a schematic depicting a basic embodiment of an electrical LC series resonating circuit according to the present disclosure, in which a tuning inductor is connected in series with a miniaturized or "micro" sample coil.

The foregoing teachings have related to the practice of the invention in the context of a parallel resonant circuit. However, the invention using a separate tuning inductor 14 with the microcoil 10 may as well be practiced in a series resonant circuit. Attention is invited to FIG. 6 in this regard. Accordingly, there is disclosed a method and apparatus for obtaining magnetic resonance signals from a microcoil 10 at low frequency, where the microcoil is electrically connected in series with a tuning coil 14 having an inductance substantially larger than the inductance of the microcoil, and yet where the microcoil functions effectively as a magnetic resonance transmitter or receiver coil while contributing no substantial inductance needed for resonance, and also where the resonant circuit of the coils 10, 14 with a capacitor may be either series resonant circuit or a parallel resonant circuit.

Figure 3:
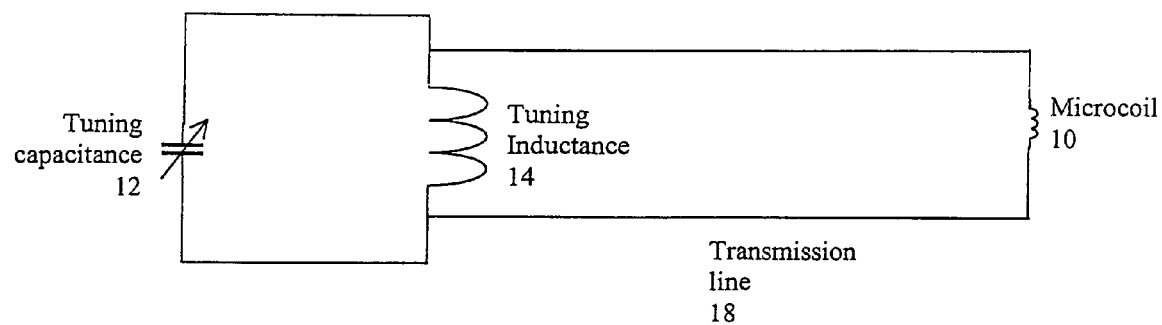
FIG. 3 is a schematic diagram depicting another embodiment of an electrical circuit according to the present disclosure, in which the miniaturized sample coil is connected in parallel with the tuning inductor via wires or cables of a length corresponding substantially to a quarter wavelength of the resonant frequency.

Attention is invited to FIG. 3, which shows an alternative embodiment of the disclosed apparatus, in which the microcoil 10 is placed some distance from the tuning capacitance 12 and the tuning inductance 14. Such an embodiment permits the invention to be practiced under circumstances where the receiving/transmitting "sensor" microcoil 10 must be remote physically from the remainder of the system, such as may be required under certain field or laboratory conditions (e.g., character or shape of the sample being evaluated, need to isolate microcoil in extreme conditions such as being placed in a cryogenic bath, and the like). The remotely located microcoil 10 is connected to the remainder of the resonant circuit by a cable or transmission line 18 that contains two separate conductors. The ends of the microcoil 10 are connected to the distal ends of the two conductors in the transmission line 18. At the proximate end of the transmission line 18, its conductors are connected to the tuning circuit elements, so that the microcoil 10 is disposed in electrical parallel with the tuning capacitance 12, the tuning inductance 14, or some portion of the tuning inductance or capacitance.

The transmission line 18 may be any electrically conducting structure that can carry signals along its length. At the frequencies of most magnetic resonance experiments, the transmission line 18 typically is a coaxial cable, although microwave-style waveguides, twisted pair wires, and other technologies known to practitioners of the art may be used. The length of the transmission line 18 is such that it achieves an impedance transformation between its proximate and distal ends (in order that the impedance of the microcoil 10 is transformed to different impedance at the point where the line 18 connects to the tuning elements 12, 14). This is most simply accomplished by providing a transmission line 18 having a length that is an odd multiple (i.e., 1×, 3×, 5×) of the length of one-fourth the wavelength of the alternating current at resonance. In this embodiment utilizing a transmission line 18, the microcoil 10 can be operated at any practically any distance from the tuning/matching components. However, a remotely operated microcoil exploits a transmission line 18 having a length of at least one-fourth the resonant wavelength. Thus, it is explicitly understood that the operation potentially may be practiced with the microcoil at practically any straight-line distance of physical separation from the tuning/matching components, regardless of the presence of the transmission line 18. But the advantage of remote operation is realized when the microcoil is functioning at a significant separation distance. Thus, in this description and in the claims, "remote" and "remotely" refer to operation of a microcoil that is located a substantial distance from the remaining elements of the resonance circuit, but remains in communication therewith by means of a transmission line. As mentioned, the transmission line 18 preferably has a length corresponding to at least one-fourth the resonant wavelength, so the microcoil 18 may function at at least such a physical separation distance from the other circuit components. A skilled practitioner of the art readily understands how to select a transmission line length to achieve an impedance transformation that allows a convenient choice for the tuning capacitance 12 and tuning inductance 14.

To use this alternative embodiment, the electrical signals in the circuit of FIG. 3 must be communicated to the remainder of the NMR/MRI electronics. This task is the same as previously discussed for the preferred embodiment, and may be achieved with any of the methods described there, or by other methods known to those skilled in the art. The microcoil 10, tuning capacitance 12, and tuning inductance 14 of the alternative embodiment operate substantially the same as the corresponding elements explained in the preferred embodiment of FIG. 1. The transmission line 18, however, must be constructed or selected so that it does not add appreciably to the resistance of the microcoil circuit.

Figure 4:
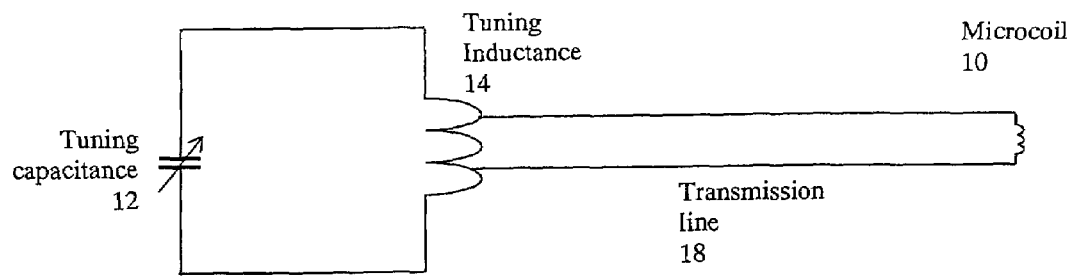
FIG. 4 is a schematic diagram, similar to FIG. 3, of yet another alternative embodiment of a circuit according to the present disclosure, showing the transmission line connected to and across a partial segment of the tuning inductor.

FIG. 4 illustrates a variation of the embodiment shown in FIG. 3. In this alternative embodiment, the microcoil 10 again is located remotely from the tuning/matching elements 12, 14. The transmission line 18 preferably has a length corresponding to an odd multiple of the length of one-fourth the wavelength of the alternating current at resonance. The microcoil 10 has a parallel connection with the tuning inductance 14; however, the transmission line 18 is connected to the tuning inductor, across a partial section thereof. Thus, only a selected segment of the overall length of the tuning coil is disposed in electrical parallel with the microcoil 10.

Figure 5:
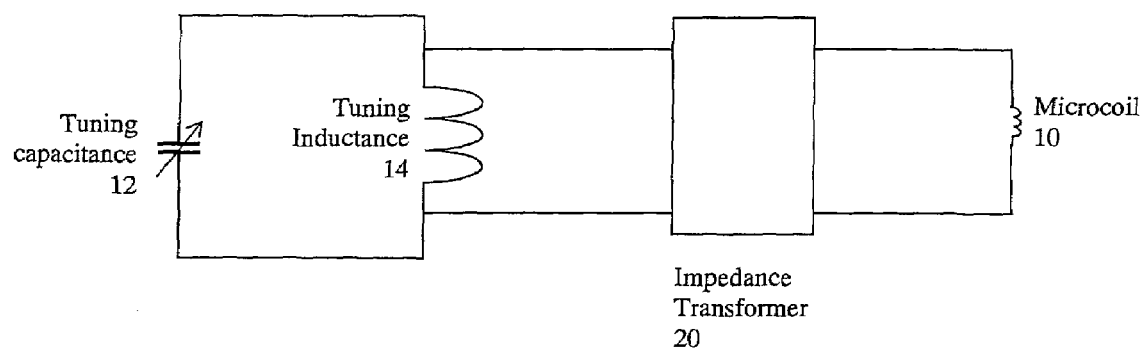
FIG. 5 is a schematic diagram, similar to FIG. 3, of yet another alternative embodiment of a circuit according to the present disclosure, showing the connection of an impedance transformer to the transmission line, between the sample coil and the tuning inductor.

Referring to FIG. 5, yet another embodiment of the "remote microcoil" version of the apparatus is disclosed which disposes an impedance transformer 20 between the microcoil 10 and the tuning inductance 14. This embodiment is substantially similar to the embodiment of FIG. 3, except that the microcoil is connected in parallel with the tuning inductance by means of the transmission line 18 and a separate impedance transformer 20. The incorporation of the impedance transformer 20 allows the microcoil 10 to be presented to the tuning inductance 14 as a large capacitor, so that the remotely located microcoil 10 is presented to the resonant circuit as a large impedance in parallel with the tuning inductance. As a result, the microcoil 10 serves as an effective magnetic resonance transmitter/receiver coil without making a significant contribution to the inductance needed for resonance.

Figure 7:
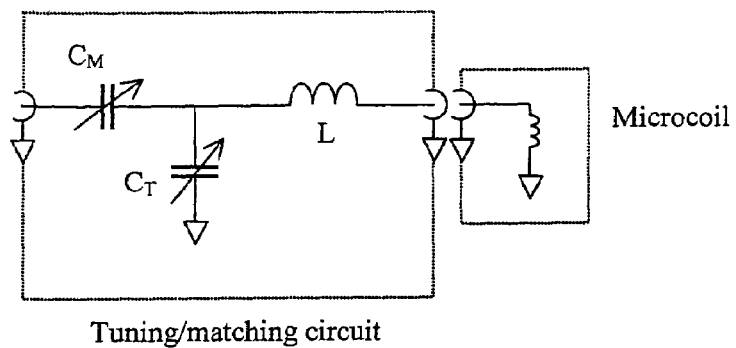
FIG. 7 is a schematic diagram elaborating somewhat on FIG. 1.
Figure 8:
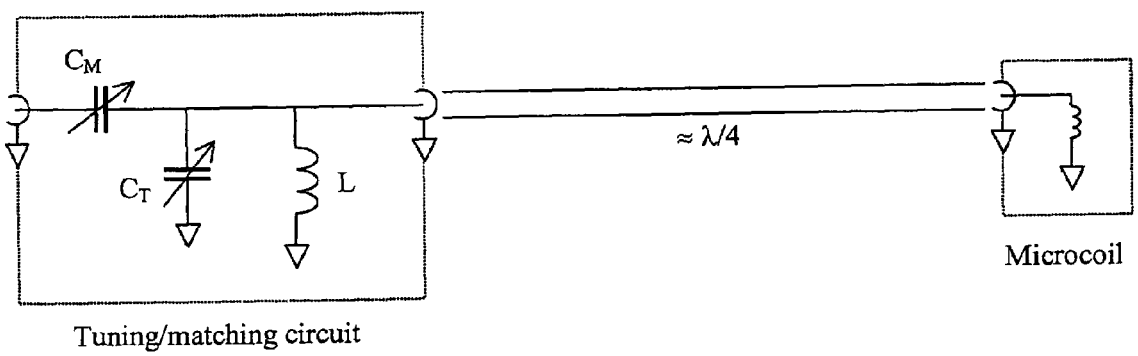
FIG. 8 is a schematic diagram elaborating somewhat on FIG. 3.
Figure 1B:
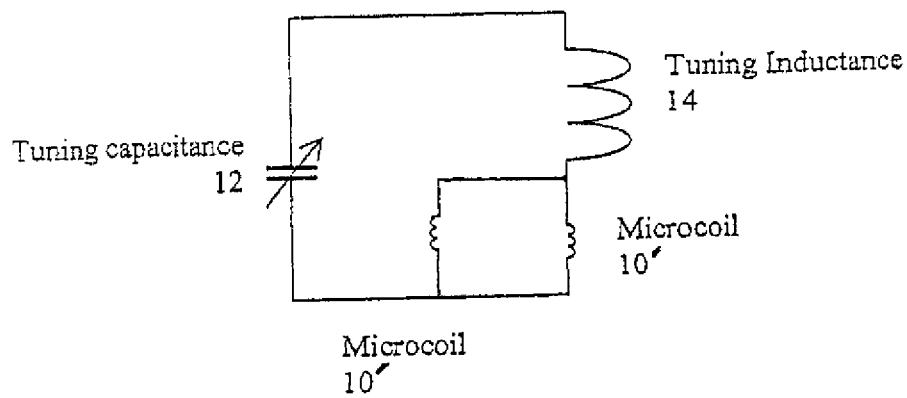
Figure 1:
Figure 1A:
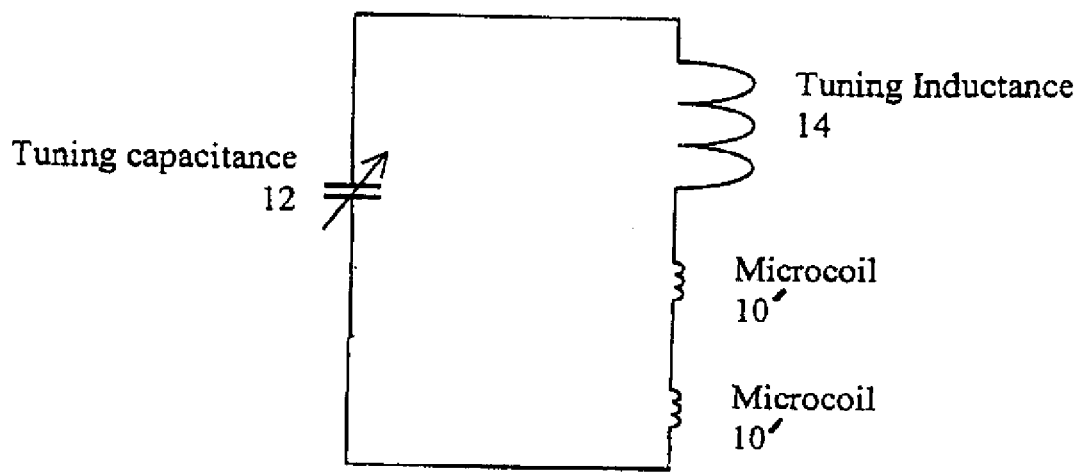
Figure 1B:
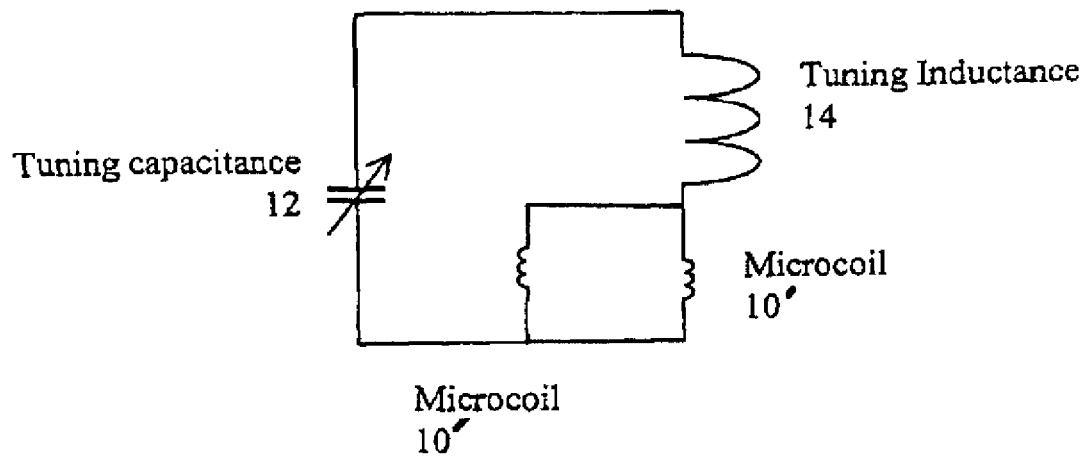

In possible applications of the foregoing disclosure, and referring to FIGS. 7 and 8, a circuit contains a variable tuning capacitance $C_T$, in resonance with an inductance, and variable coupling (or matching) capacitance $C_M$ used to properly couple the resonant circuit to the 50Ω transmitter and receiver of a NMR spectrometer (not shown). The capacitances $C_T$, $C_M$ can consist of single or multiple variable capacitors, combined in series or parallel, which may be additionally mounted in parallel or series with fixed capacitors. The inductance is the very small sample microcoil together with a (typically larger) tuning coil L.

Two possibilities for combining the sample microcoil and "tuning" coil are contemplated. The circuit of FIG. 7, which is an elaboration on the information provided in FIG. 1, adds the two coils in series. The circuit of FIG. 8, expanding on the disclosure of FIG. 3, places the sample coil at the distal end of a cable of length roughly equal to a quarter-wavelength at the resonant frequency. The other, proximate, end of the cable is connected in parallel with the larger coil. The effect is to transform the reactance of the sample coil to a much larger value (via the cable) and then place this reactance in parallel with the larger coil. (The small inductance of the sample coil is transformed into a larger capacitive reactance by this cable.) The value of the large inductance, L, can be chosen so that the circuit achieves electrical resonance at the desired frequency without requiring awkwardly large values for the capacitances.

The methodology of the present invention is apparent from the foregoing, but may be summarized in a procedural format. The method of the present disclosure is for obtaining magnetic resonance signals from a microcoil at low frequency. It includes in most basic procedure the steps of connecting a microcoil in series to a second, tuning, coil typically having a substantially larger inductance, and forming a resonant circuit of the combined coils with a capacitor, such that the microcoil functions as an effective magnetic resonance transmitter/receiver coil, but without the microcoil making a significant contribution to the inductance needed for parallel resonance so that the capacitor's capacitance is determined primarily by the inductance of the tuning coil. It should be appreciated that connecting a microcoil in series with a second, tuning, coil may be a step of connecting electrically in mutual series a plurality of microcoils, so that an assembly of coils may be substituted for a single microcoil. Alternatively, such a plurality of microcoils may be mutually connected in parallel to constitute the assembly of coils that is substituted for a single microcoil, and then connecting the plural assembly in series with the second or "tuning" coil.

A method according to this disclosure permits obtaining magnetic resonance signals, at low frequency, from a microcoil located remotely from the tuning/matching elements. This benefit is realized by connecting, in parallel, a microcoil and a second or tuning coil with a transmission line that is an odd multiple of the length of one-fourth of the wavelength of the alternating current at resonance. The second coil is constructed to provide with a substantially larger inductance and is electrically connected to a capacitor to form part of a parallel resonant circuit. The remotely located microcoil presents as large impedance in parallel to the second coil to act as an effective magnetic resonance transmitter/receiver coil, yet without making a significant contribution to the inductance needed for parallel resonance. As with the basic preferred process, connecting a microcoil in parallel with a second or "tuning" coil may be the step of connecting in mutual series or in parallel a plurality of micro coils, so that an assembly of microcoils may be substituted for a single microcoil.

In the method for obtaining magnetic resonance signals from a microcoil located remotely from the tuning/matching elements and at low frequency, the process steps may include connecting in parallel the microcoil with a cable that is an odd multiple of the length of one-fourth the wavelength of the alternating current at resonance to only a partial section of the large-inductance second coil. Connecting these with a capacitor to provide a resonant circuit, an apparatus thereby is provided whereby the remotely located microcoil will function as impedance in parallel to the second coil to act as an effective magnetic resonance transmitter/receiver, coil without making a significant contribution to the inductance needed for parallel resonance.

Alternative method steps include connecting in parallel the microcoil with a transmission line and an impedance transformer that will present the microcoil as a large capacitor to a second coil having substantially larger inductance, and connecting these to a capacitor to define part of a resonant circuit, whereby the microcoil at a distance from the resonant circuit presents the microcoil as a large impedance in parallel to the said second coil to be an effective magnetic resonance transmitter/receiver coil without making a significant contribution to the inductance needed for resonance.

In sum, "extra" inductance, in the form of a large coil, is deliberately included in the circuit of this disclosure. Such stray inductance is generally and previously regarded as flaw in NMR resonant circuit design, due to an assumption that the stray inductance will decrease the efficiency of signal detection. However, we have determined that application of known circuit design principles avoids degradation in detection efficiency, provided the extra inductance does not add appreciably to the electrical resistance of the circuit. Conventional circuit design approaches for NMR resonant circuits, which do not allow the extra inductance, are not capable of yielding practical, easy-to-tune circuits for small sample coils operating at low resonance frequencies, such as below 100 MHz. Indeed, no resonant circuits for very small sample coils (<25 nH impedance) are known to be operable at resonant frequencies below 100 MHz. According to the presently disclosed system, the capacitances and tuning inductance can be mounted in a position remote from the "micro" sample coil. Readily manipulated knobs or other adjustment aids can be attached to the capacitances, since they are not subject to space constraints. A transmission cable can be used to connect the sample coil to the main resonant circuit, facilitating remote operation and the miniaturization of a NMR probe.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, patents, and publications cited above are hereby incorporated by reference.

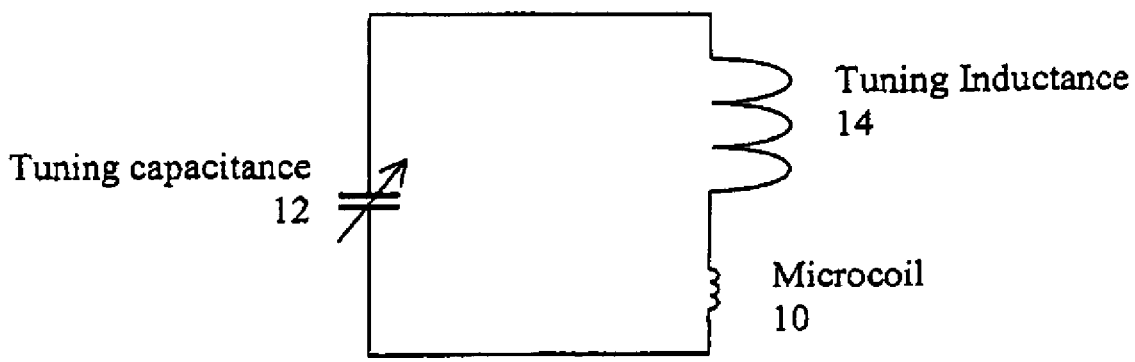

I claim:

1. A method for obtaining magnetic resonance signals from a microcoil at low frequency comprising the steps of:
   connecting the microcoil in series with a second coil, whereby the microcoil is an effective magnetic resonance transmitter or receiver coil;
   forming a resonant circuit of the coils with a capacitor whose capacitance is determined primarily by the inductance of the second coil;
   permitting the resonant circuit to resonate at low frequency, with alternating current at a resonance wavelength;
   locating the microcoil remotely from the second coil and capacitor; and
   connecting electrically the microcoil in parallel with the second coil by means of a transmission line having a length that is an odd multiple of a length corresponding substantially to one-fourth of the resonance wavelength;
   whereby the remotely located microcoil presents, in the resonant circuit, as a large impedance in parallel to the second coil.

2. A method according to claim 1, wherein the step of connecting the microcoil in parallel with the second coil comprises connecting the transmission line to a partial segment of the second coil.

3. A method according to claim 1, wherein the step of connecting the microcoil in parallel with the second coil comprises connecting an impedance transformer to the transmission line intermediate to the microcoil and the second coil.

4. A method according to claim 1 wherein the step of connecting the microcoil in series with a second coil comprises connecting electrically a plurality of microcoils in series, and connecting said plurality of microcoils in series with the second coil.

5. A method according to claim 1 wherein the step of connecting the microcoil in series with a second coil comprises connecting electrically a plurality of microcoils in parallel, and connecting said plurality of microcoils in series with the second coil.

6. A method for obtaining magnetic resonance signals from a microcoil at low frequency, comprising the steps of:
   connecting the microcoil in series with a tuning coil having an inductance at least ten times larger than the inductance of the microcoil, whereby the microcoil is an effective magnetic resonance transmitter or receiver coil and contributes no substantial inductance needed for resonance;
   forming a resonant circuit of the coils with a capacitor whose capacitance is determined primarily by the inductance of the tuning coil and;
   permitting the resonant circuit to resonate at low frequency, with alternating current at a resonance wavelength.

7. A method according to claim 6 wherein the step of forming a resonant circuit comprises forming a parallel resonant circuit wherein the microcoil contributes no substantial inductance needed for parallel resonance.

8. A method according to claim 7 wherein the step of connecting the microcoil in series with a tuning coil comprises connecting electrically a plurality of microcoils together, and connecting said plurality of interconnected microcoils in series with the tuning coil.

9. A method according to claim 7 further comprising the steps of:
   locating the microcoil remotely from tuning coil and capacitor; and
   connecting electrically the microcoil in parallel with the tuning coil by means of a transmission line having a length that is an odd multiple of a length corresponding substantially to one-fourth of the resonance wavelength;
   whereby the remotely located microcoil presents, in the resonant circuit, as a large impedance in parallel to the tuning coil.

10. A method according to claim 9, wherein the step of connecting the microcoil in parallel with the tuning coil comprises connecting the transmission line to a partial segment of the tuning coil.

11. A method according to claim 6 wherein the step of forming a resonant circuit comprises forming a series resonant circuit wherein the microcoil contributes no substantial inductance needed for series resonance.

12. A method according to claim 11 wherein the step of connecting the microcoil in series with a tuning coil comprises connecting electrically a plurality of microcoils together, and connecting said plurality of interconnected microcoils in series with the tuning coil.

13. A method according to claim 11 further comprising the steps of:
   locating the microcoil remotely from tuning coil and capacitor; and
   connecting electrically the microcoil in parallel with the tuning coil by means of a transmission line having a length that is an odd multiple of a length corresponding substantially to one-fourth of the resonance wavelength;
   whereby the remotely located microcoil presents, in the resonant circuit, as a large impedance in parallel to the tuning coil.

14. A method according to claim 13, wherein the step of connecting the microcoil in parallel with the tuning coil comprises connecting the transmission line to a partial segment of the tuning coil.

15. A method according to claim 13, wherein the step of connecting the microcoil in parallel with the tuning coil comprises connecting an impedance transformer to the transmission line intermediate to the microcoil and the tuning coil.

* * * * *

UNITED STATES PATENT AND TRADEMARK OFFICE
CERTIFICATE OF CORRECTION

| | | |
|---|---|---|
| PATENT NO. | : 7,405,567 B2 | Page 1 of 3 |
| APPLICATION NO. | : 11/507296 | |
| DATED | : July 29, 2008 | |
| INVENTOR(S) | : McDowell | |

It is certified that error appears in the above-identified patent and that said Letters Patent is hereby corrected as shown below:

Title page should be deleted and substitute therefor the attached title page.

Figure 1B:
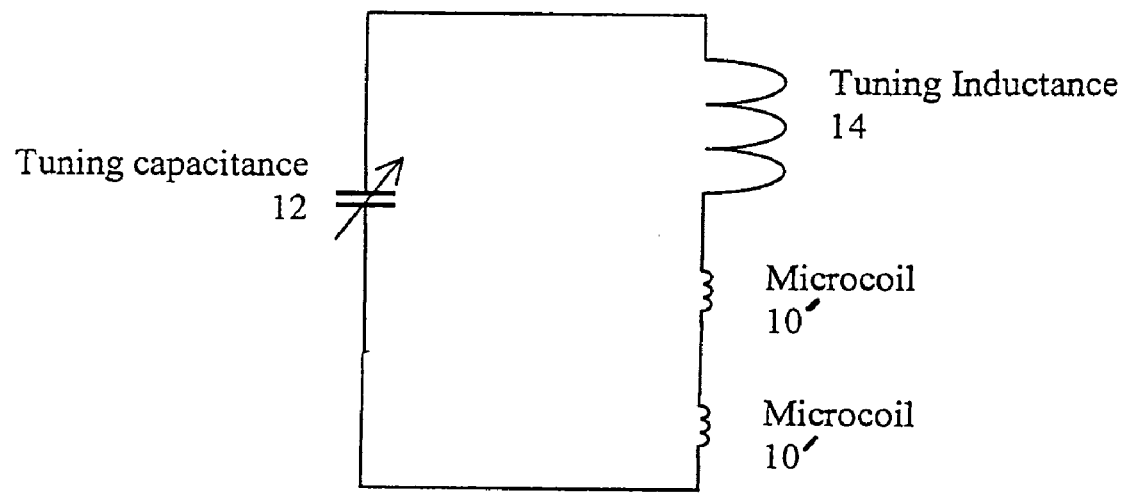
FIG. 1B is a schematic depicting the circuit shown in FIG. 1, except with the single sample coil replaced by a plurality of coils connected in parallel.
Figure 1A:
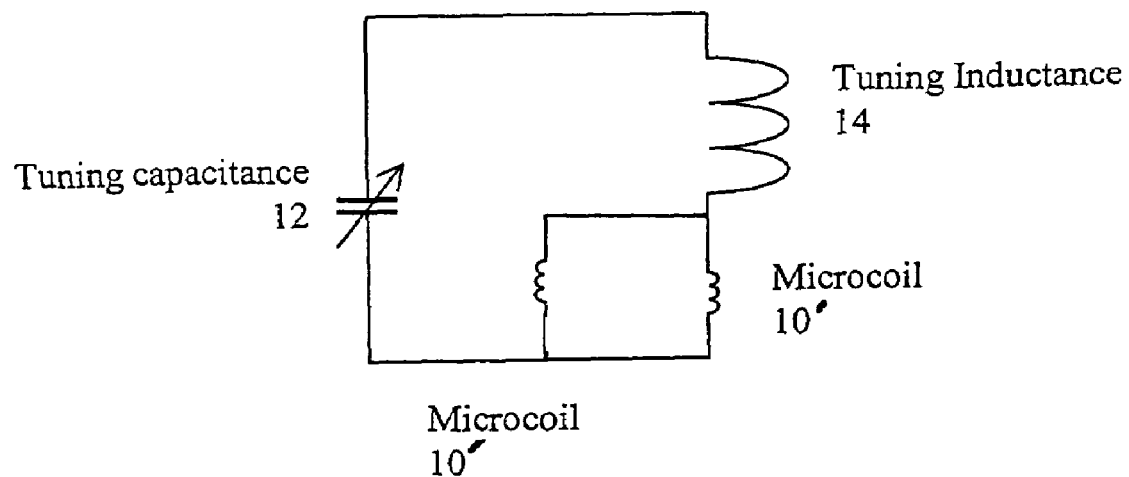
FIG. 1A is a schematic depicting the circuit shown in FIG. 1, except with the single sample coil replaced by a plurality of coils connected in series.

Sheet 2 of 6, please delete "FIG. 1A" and replace with --FIG. 1B--, as shown on attached page.

Signed and Sealed this

Eighteenth Day of August, 2009

David J. Kappos
*Director of the United States Patent and Trademark Office*

(12) United States Patent
McDowell

(10) Patent No.: US 7,405,567 B2
(45) Date of Patent: Jul. 29, 2008

(54) TUNING LOW-INDUCTANCE COILS AT LOW FREQUENCIES

(75) Inventor: Andrew F. McDowell, Albuquerque, NM (US)

(73) Assignee: ABQMR, Inc., Albuquerque, NM (US)

(*) Notice: Subject to any disclaimer, the term of this patent is extended or adjusted under 35 U.S.C. 154(b) by 0 days.

(21) Appl. No.: 11/507,296

(22) Filed: Aug. 21, 2006

(65) Prior Publication Data

US 2008/0042650 A1 Feb. 21, 2008

(51) Int. Cl.
*G01V 3/00* (2006.01)
(52) U.S. Cl. .................................. 324/318; 324/322
(58) Field of Classification Search ................. 324/318, 324/322
See application file for complete search history.

(56) References Cited

U.S. PATENT DOCUMENTS

| | | | |
|---|---|---|---|
| 5,684,401 A | 11/1997 | Peck et al. | |
| 6,242,915 B1 | 6/2001 | Hurd | |
| 6,397,094 B1 | 5/2002 | Ludeke et al. | |
| 6,487,437 B1 | 11/2002 | Viswanathan et al. | |
| 6,512,941 B1 | 1/2003 | Weiss et al. | |
| 6,788,061 B1 | 9/2004 | Sweedler et al. | |
| 6,845,262 B2 * | 1/2005 | Albert et al. | 600/420 |
| 7,141,978 B2 * | 11/2006 | Peck et al. | 324/321 |
| 2002/0130661 A1 * | 9/2002 | Raftery et al. | 324/318 |
| 2005/0245814 A1 | 11/2005 | Anderson et al. | |

FOREIGN PATENT DOCUMENTS

| | | |
|---|---|---|
| CA | 2342047 A1 | 9/2001 |
| EP | 1304581 A2 | 4/2003 |
| WO | WO 01/73460 A1 | 10/2001 |
| WO | WO 2005/026762 A1 | 3/2005 |

OTHER PUBLICATIONS

Goloshevsky, A.G., et al; "Development of low field nuclear magnetic resonance microcoils"; Rev. Sci. Inst., vol. 76, p. 024101 (2005).
Moresi, G., et al.; "Miniature permanent magnet for table-top NMR"; Concept. Magn. Reson., v. 19B, p. 35 (2003).
Peck, T.L., et al.; "Design and analysis of microcoils for NMR microscopy"; J. Magn. Reson., v. 108, p. 114 (1995).

(Continued)

*Primary Examiner*—Brij B. Shrivastav
*Assistant Examiner*—Megann E Vaughn
(74) *Attorney, Agent, or Firm*—McDonnell, Boehnen, Hulbert & Berghoff LLP

(57) ABSTRACT

A method and apparatus for tuning and matching extremely small sample coils with very low inductance for use in magnetic resonance experiments conducted at low frequencies. A circuit is disclosed that is appropriate for performing measurements in fields where magnetic resonance is beneficially utilized. The circuit has a microcoil, an adjustable tuning capacitance, and added inductance in the form of a tuning inductor. The microcoil is an electrical coil having an inductance of about 25 nanohenries (nH) or less. Because additional inductance is purposefully added, the capacitance required for resonance and apparatus function is proportionally and helpfully reduced. The apparatus and method permit the resonant circuit and the magnet to be made extremely small, which is crucial for new applications in portable magnetic resonance imaging, for example.

15 Claims, 6 Drawing Sheets

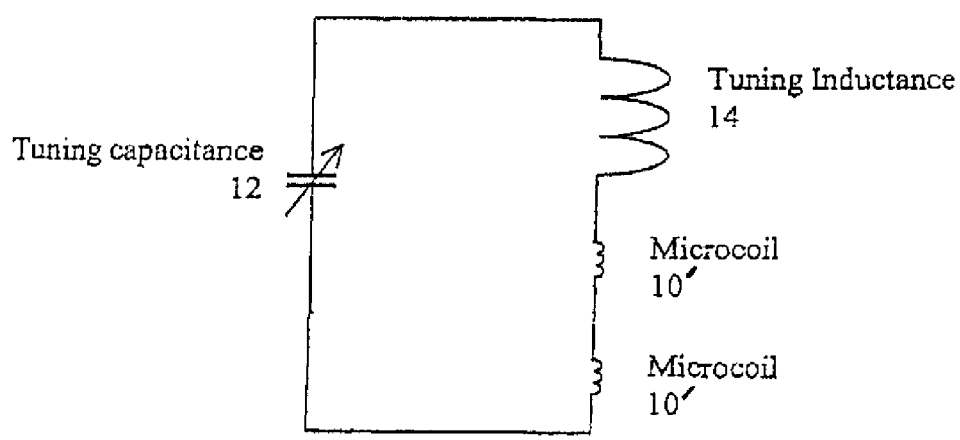

UNITED STATES PATENT AND TRADEMARK OFFICE
CERTIFICATE OF CORRECTION

PATENT NO. : 7,405,567 B2
APPLICATION NO. : 11/507296
DATED : July 29, 2008
INVENTOR(S) : Andrew F. McDowell It is certified that error appears in the above-identified patent and that said Letters Patent is hereby corrected as shown below:

The title page showing illustrative figure (as substituted by the Certificate of Correction issued August 18, 2009) should be deleted and title page in original printed in patent, is to be reinstated as shown on attached page.

Drawing Sheet 1 of 6, delete "FIG. 1B" and replace with --FIG. 1A--, as shown on attached Drawing Sheet 1 of 6.

Drawing Sheet 2 of 6, delete "FIG. 1A" and replace with --FIG. 1B--, as shown on attached Drawing Sheet 2 of 6.

This certificate supersedes the Certificate of Correction issued August 18, 2009.

Signed and Sealed this

Tenth Day of November, 2009

David J. Kappos
*Director of the United States Patent and Trademark Office*

United States Patent
McDowell

(10) Patent No.: US 7,405,567 B2
(45) Date of Patent: Jul. 29, 2008

(54) TUNING LOW-INDUCTANCE COILS AT LOW FREQUENCIES

(75) Inventor: Andrew F. McDowell, Albuquerque, NM (US)

(73) Assignee: ABQMR, Inc., Albuquerque, NM (US)

( * ) Notice: Subject to any disclaimer, the term of this patent is extended or adjusted under 35 U.S.C. 154(b) by 0 days.

(21) Appl. No.: 11/507,296

(22) Filed: Aug. 21, 2006

(65) Prior Publication Data

US 2008/0042650 A1    Feb. 21, 2008

(51) Int. Cl.
*G01V 3/00* (2006.01)
(52) U.S. Cl. .............................. 324/318; 324/322
(58) Field of Classification Search ............... 324/318, 324/322
See application file for complete search history.

(56) References Cited

U.S. PATENT DOCUMENTS

| | | | |
|---|---|---|---|
| 5,684,401 A | 11/1997 | Peck et al. | |
| 6,242,915 B1 | 6/2001 | Hurd | |
| 6,397,094 B1 | 5/2002 | Ludeke et al. | |
| 6,487,437 B1 | 11/2002 | Viswanathan et al. | |
| 6,512,941 B1 | 1/2003 | Weiss et al. | |
| 6,788,061 B1 | 9/2004 | Sweedler et al. | |
| 6,845,262 B2 * | 1/2005 | Albert et al. | 600/420 |
| 7,141,978 B2 * | 11/2006 | Peck et al. | 324/321 |
| 2002/0130661 A1 * | 9/2002 | Raftery et al. | 324/318 |
| 2005/0245814 A1 | 11/2005 | Anderson et al. | |

FOREIGN PATENT DOCUMENTS

| | | |
|---|---|---|
| CA | 2342047 A1 | 9/2001 |
| EP | 1304581 A2 | 4/2003 |
| WO | WO 01/73460 A1 | 10/2001 |
| WO | WO 2005/026762 A1 | 3/2005 |

OTHER PUBLICATIONS

Goloshevsky, A.G., et al.; "Development of low field nuclear magnetic resonance microcoils"; Rev. Sci. Inst., vol. 76, p. 024101 (2005).

Moresi, G., et al.; "Miniature permanent magnet for table-top NMR"; Concept. Magn. Reson., v. 19B, p. 35 (2003).

Peck, T.L., et al.; "Design and analysis of microcoils for NMR microscopy"; J. Magn. Reson., v. 108, p. 114 (1995).

(Continued)

*Primary Examiner*—Brij B. Shrivastav
*Assistant Examiner*—Megann E Vaughn
(74) *Attorney, Agent, or Firm*—McDonnell, Boehnen, Hulbert & Berghoff LLP

(57) ABSTRACT

A method and apparatus for tuning and matching extremely small sample coils with very low inductance for use in magnetic resonance experiments conducted at low frequencies. A circuit is disclosed that is appropriate for performing measurements in fields where magnetic resonance is beneficially utilized. The circuit has a microcoil, an adjustable tuning capacitance, and added inductance in the form of a tuning inductor. The microcoil is an electrical coil having an inductance of about 25 nanohenries (nH) or less. Because additional inductance is purposefully added, the capacitance required for resonance and apparatus function is proportionally and helpfully reduced. The apparatus and method permit the resonant circuit and the magnet to be made extremely small, which is crucial for new applications in portable magnetic resonance imaging, for example.

15 Claims, 6 Drawing Sheets